United States Patent
Zang et al.

(10) Patent No.: US 11,450,570 B2
(45) Date of Patent: Sep. 20, 2022

(54) SINGLE DIFFUSION CUT FOR GATE STRUCTURES

(71) Applicant: GLOBALFOUNDRIES U.S. INC., Santa Clara, CA (US)

(72) Inventors: Hui Zang, Guilderland, NY (US); Ruilong Xie, Niskayuna, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 97 days.

(21) Appl. No.: 16/367,733

(22) Filed: Mar. 28, 2019

(65) Prior Publication Data

US 2020/0312718 A1 Oct. 1, 2020

(51) Int. Cl.
| | |
|---|---|
| H01L 21/8238 | (2006.01) |
| H01L 21/8234 | (2006.01) |
| H01L 29/66 | (2006.01) |
| H01L 21/768 | (2006.01) |
| H01L 27/088 | (2006.01) |
| H01L 29/78 | (2006.01) |

(52) U.S. Cl.
CPC ........... *H01L 21/823437* (2013.01); *H01L 21/76831* (2013.01); *H01L 21/823431* (2013.01); *H01L 27/0886* (2013.01); *H01L 29/66545* (2013.01); *H01L 29/66795* (2013.01); *H01L 29/785* (2013.01)

(58) Field of Classification Search
CPC ... H01L 29/66795–66818; H01L 29/785–792; H01L 27/0886; H01L 21/823481; H01L 21/823431; H01L 21/823821; H01L 21/823878; H01L 21/302; H01L 21/823437; H01L 21/76831; H01L 29/66545
See application file for complete search history.

(56) References Cited

U.S. PATENT DOCUMENTS

| | | | |
|---|---|---|---|
| 8,846,491 B1 | 9/2014 | Pham et al. | |
| 8,916,460 B1 | 12/2014 | Kwon et al. | |
| 2014/0117454 A1 | 5/2014 | Liu et al. | |
| 2015/0021710 A1* | 1/2015 | Hsu | H01L 21/76224 257/401 |
| 2016/0163604 A1* | 6/2016 | Xie | H01L 27/1211 438/430 |
| 2019/0165137 A1* | 5/2019 | Chen | H01L 21/823821 |
| 2019/0267372 A1* | 8/2019 | Wen | H01L 21/823437 |
| 2020/0020570 A1* | 1/2020 | Sung | H01L 29/7851 |

* cited by examiner

*Primary Examiner* — Eric K Ashbahian
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a single diffusion cut for gate structures and methods of manufacture. The structure includes: a plurality of fin structures; a plurality of gate structures extending over the plurality of fin structures; a plurality of diffusion regions adjacent to the each of the plurality of gate structures; a single diffusion break between the diffusion regions of the adjacent gate structures; and a liner separating the single diffusion break from the diffusion regions.

21 Claims, 10 Drawing Sheets

SINGLE DIFFUSION CUT FOR GATE STRUCTURES

FIELD OF THE INVENTION

The present disclosure relates to semiconductor structures and, more particularly, to a single diffusion cut for gate structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate features due to the critical dimension (CD) scaling and process capabilities.

For example, in the fabrication of FinFET structures, single diffusion breaks become very attractive in standard cell scaling. The processes for fabricating the single diffusion breaks, though, are very challenging in advanced technologies. By way of illustration, conventionally, multiple Rx regions in a semiconductor integrated circuit include arrays of parallel extending fins having distal ends abutting the edges of each Rx region. The fin arrays are terminated by dummy gates, which extend laterally across the distal ends of the fins at the edges of the Rx regions. The dummy gates are used to induce symmetrical epitaxial growth of source/drain regions (S/D regions) on the end portions of the fins located between the dummy gates and adjacent active gates.

To fabricate the single diffusion break, a deep trench undercut adjacent to the source and drain epitaxial regions is provided by removing the dummy gate structure (poly material). The deep trench etch undercut damages or removes portions of the epitaxial source and drain regions. This results in smaller source/drain epitaxial volume and electrical contact area compared to that of the source and drain regions located between active gates. The smaller source and drain region volume and contact area can lead to greater contact resistance and degrade device performance.

SUMMARY

In an aspect of the disclosure, a structure comprises: a plurality of fin structures; a plurality of gate structures extending over the plurality of fin structures; a plurality of diffusion regions adjacent to the each of the plurality of gate structures; a single diffusion break between the diffusion regions of the adjacent gate structures; and a liner separating the single diffusion break from the diffusion regions.

In an aspect of the disclosure, a structure comprises: a substrate material; a plurality of metal gate structures on the substrate material and comprising sidewall spacers, metal material and source and drain regions; a single diffusion break structure between adjacent metal gate structures of the plurality of metal gate structures, the single diffusion break structure extending into the substrate; and a liner on sidewalls of the single diffusion break structure separating the single diffusion break structure from the source and drain regions.

In an aspect of the disclosure, the method comprises: forming a plurality of fin structures from a substrate material; forming dummy gate structures comprising dummy material over the plurality of fin structures; forming diffusion regions adjacent to the dummy gate structures; forming a first trench in the dummy material; forming a liner within the first trench; etching a bottom surface of the liner to form a second trench within the substrate material; filling the first trench and the second trench with a dielectric material to form a single diffusion break having the liner on its sidewalls; and replacing the dummy gate structures with replacement gate structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a single diffusion cut for gate structures and methods of manufacture. More specifically, the present disclosure provides a single diffusion cut process with a dielectric liner and dielectric fin structures for advanced FinFET technologies. Advantageously, the structures and processes described herein eliminate damage and/or defects to epitaxial source/drain regions during replacement metal gate processes, e.g., during deep trench etch processes to remove the dummy gate material, while enjoying the benefits of an aligned single diffusion break. Accordingly, the structures and processes described herein allow for device performance to be maintained even at smaller technology nodes, e.g., 10 nm technology nodes and smaller.

In embodiments, the structures and processes described herein allow for the preservation of the epitaxial material of the source and drain regions during fabrication of a single diffusion break. By maintaining the integrity of the epitaxial material, several advantages are obtained. These advantages include a relatively wider single diffusion break process window, together with a self-aligned reverse block of a fin cut. Additionally, there is improvement in the growth of epitaxial material of the source and drain regions because of the protection provided by the liner. All these advantages allow for device performance to be maintained.

An additional benefit of the structures and processes described herein is that there is a relatively less gate height budget requirement, since there are no boundary issues for the subsequently formed replacement gate structures. More specifically, the device is free from boundary induced issues, such as incomplete metal fill, metal stress and/or impact. Additionally, the structures and processes described herein allow for the fin structures to be cut before removal of the polysilicon material, thereby retaining the original channel strain.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures use three basic building blocks: (i) deposition of thin films of material on a substrate, (ii) applying a patterned mask on top of the films by photolithographic imaging, and (iii) etching the films selectively to the mask.

Figure 1A:
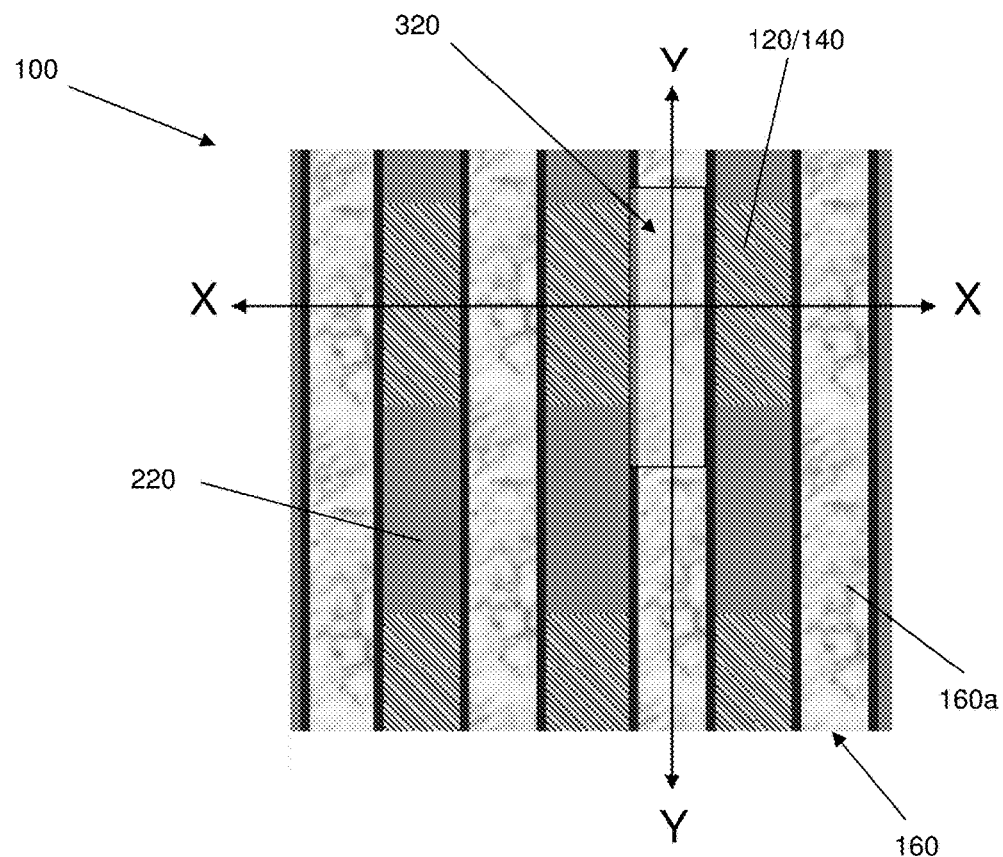
FIG. 1A shows a top view of an incoming structure and respective fabrication processes in accordance with aspects of the present disclosure.
Figure 1B:
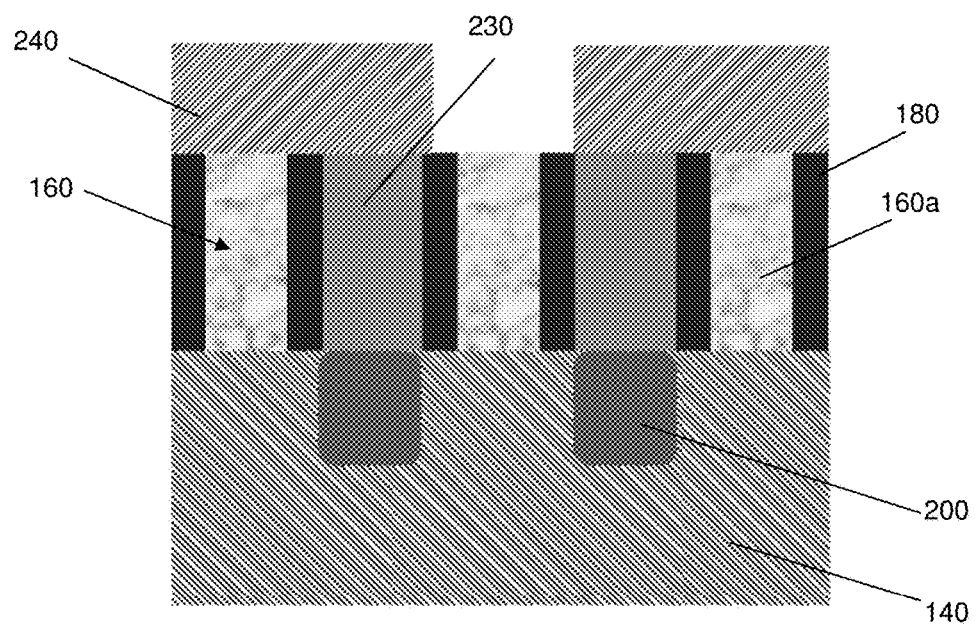
FIG. 1B shows a cross-sectional view along line X-X of FIG. 1A.
Figure 1C:
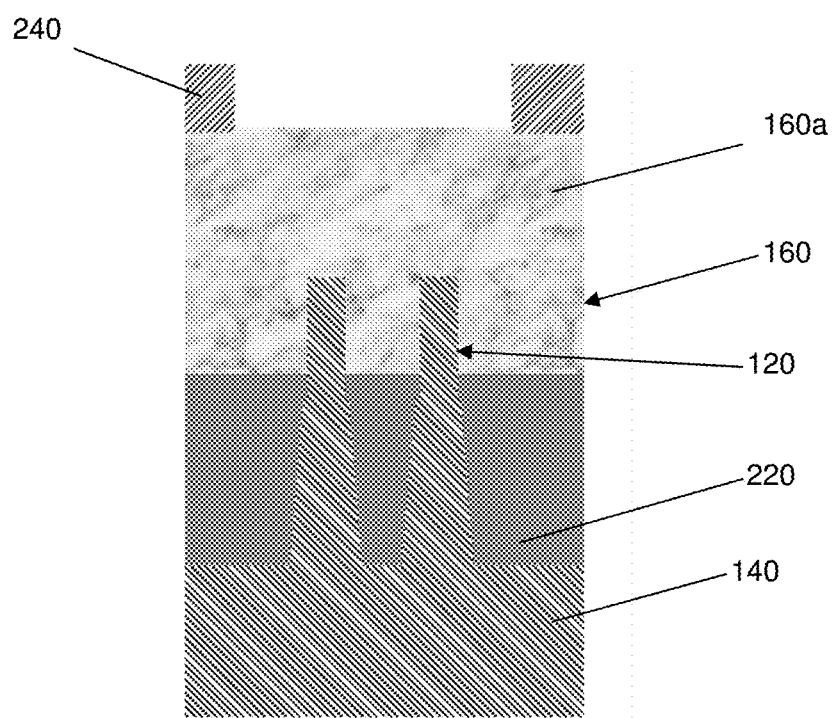
FIG. 1C shows a cross-sectional view along line Y-Y of FIG. 1A.

FIG. 1A shows a top view of an incoming structure and respective fabrication processes in accordance with aspects of the present disclosure. FIG. 1B shows a cross-sectional view along line X-X of FIG. 1A and FIG. 1C shows a cross-sectional view along line Y-Y of FIG. 1A. Referring to FIGS. 1A-1C, the structure 100 includes a plurality of fin structures 120 which are tapered and composed of any suitable substrate material 140. In embodiments, the substrate material 140 can be composed of any suitable material including, but not limited to, Si, SiGe, SiGeC, SiC, GaAs, InAs, InP, and other III/V or II/VI compound semiconductors.

The fin structures 120 can be fabricated using conventional patterning processes including, e.g., sidewall imaging transfer (SIT) techniques. In an example of a SIT technique, a mandrel material, e.g., $SiO_2$, is deposited on the substrate material 140 using conventional chemical vapor deposition (CVD) processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions between the fin structures 120.

Spacers are formed on the sidewalls of the mandrels which are preferably composed of a material that is different than the mandrels, and which are formed using conventional deposition processes known to those of skill in the art. The mandrels are removed or stripped using a conventional etching process, selective to the mandrel material. An etching is then performed within the spacing of the spacers to form the sub-lithographic features. Due to the etching process, the fin structures 120 can have a tapered profile as shown in FIG. 1C, for example. The sidewall spacers can then be stripped.

Dummy gate structures 160 extend orthogonally over the fin structures 120. In embodiments, the dummy gate structures 160 are composed of polysilicon material 160a, which is deposited over the fin structures 120 and patterned using conventional lithography and etching processes such that no further explanation is required herein for an understanding of the formation of the dummy gate structures 160. A sidewall spacer material is deposited and patterned over the dummy gate structures 160. In embodiments, the sidewall spacer material is a low-k dielectric material, e.g., nitride, deposited by a conventional CVD process, followed by an anisotropic etching process to expose the upper surface of the polysilicon material 160a of the dummy gate structures 160 to form the sidewall spacers 180.

As shown in FIG. 1B, source and drain regions 200 are formed adjacent to the dummy gate structures 160. In embodiments, the source and drain regions 200 can be fabricated by conventional processes including doped epitaxial processes to form raised source and drain regions. In alternative embodiments, the source and drain regions 200 can be planar and subjected to ion implantation or doping processes to form diffusion regions as is known in the art.

FIGS. 1A and 1C show isolation regions (shallow trench isolation regions) 220 which can be formed adjacent to the dummy gate structures 160 and between the fin structures 120. The isolation regions 220 can be, e.g., oxide, deposited by conventional CVD processes, followed by a planarization process such as a chemical mechanical polishing (CMP). In embodiments, an oxide material 230 is deposited between the dummy gate structures 160 and over the fin structures 120 by conventional CVD processes, followed by a CMP.

FIG. 1A shows a single diffusion break region 320, which represents an area where a single diffusion break can be implemented. A single diffusion break can be desirable because it allows for the prevention of undesired current flow between the fin structures 120, thereby improving device performance. In embodiments, a hardmask 240 is formed over select dummy gate structures 160, thereby leaving at least one dummy gate structure 160 exposed for a cut of the single diffusion break to be fabricated.

Figure 2A:
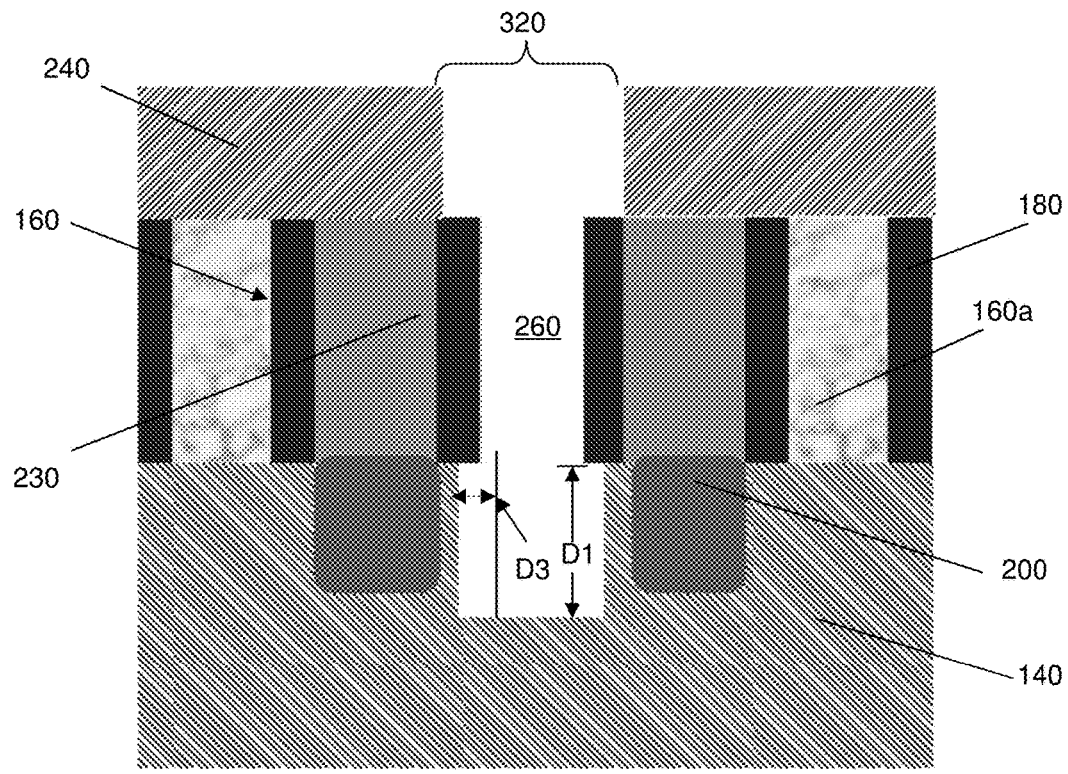
FIGS. 2A and 2B are cross-sectional views showing an undercut, amongst other features, and respective fabrication processes in accordance with aspects of the present disclosure.
Figure 2B:
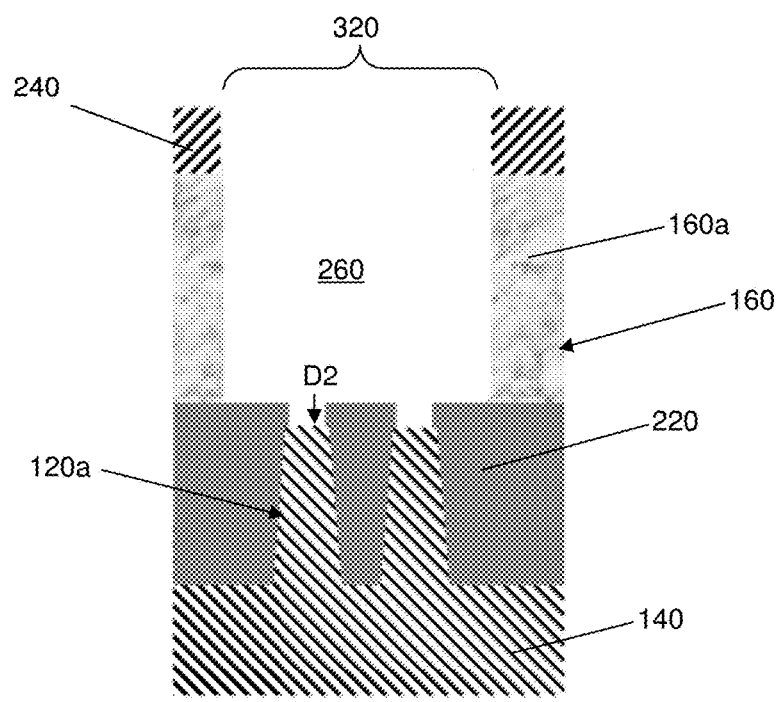

FIGS. 2A and 2B show an over-etching and undercut within the fin structures 120, and particularly the substrate material 140 of the fin structures 120. Specifically, an etching process with a selective chemistry, e.g., RIE, is used to open the single diffusion break region 320 by removing the polysilicon material 160a of the exposed dummy gate structure 160, thereby exposing the substrate material 140 of the fin structures 120. As an example, the etching process includes a nitride etch, followed by a poly dummy gate material etch, stopping on the substrate material 140.

A trench 260 is formed by removing the substrate material 140 of the fin structures 120 through the openings of the hardmask 240. In embodiments, this over-etching is represented by the distances D1 and D2. Distance D1 represents an over-etch into the substrate material 140 which extends below a bottom surface of the source and drain regions 200. Distance D2 represents an etching of the fin structures 120 below a top surface of the isolation regions 220, thereby forming the recessed fin structures 120a. In embodiments, the distance D2 can be about 2.5 nm, amongst other examples. Distance D3 represents a distance from an edge of the substrate material 140 to an edge of the sidewall spacer 180 of an undercut feature, which results from the etching of the trench. The structures and processes described herein allow for the protection of the epitaxial material of the source and drain regions 200 by depositing an oxide material to protect the sidewalls of the source and drain regions 200 from the undercut, i.e., the exposed substrate material 140 underneath the sidewall spacer 180.

Figure 3A:
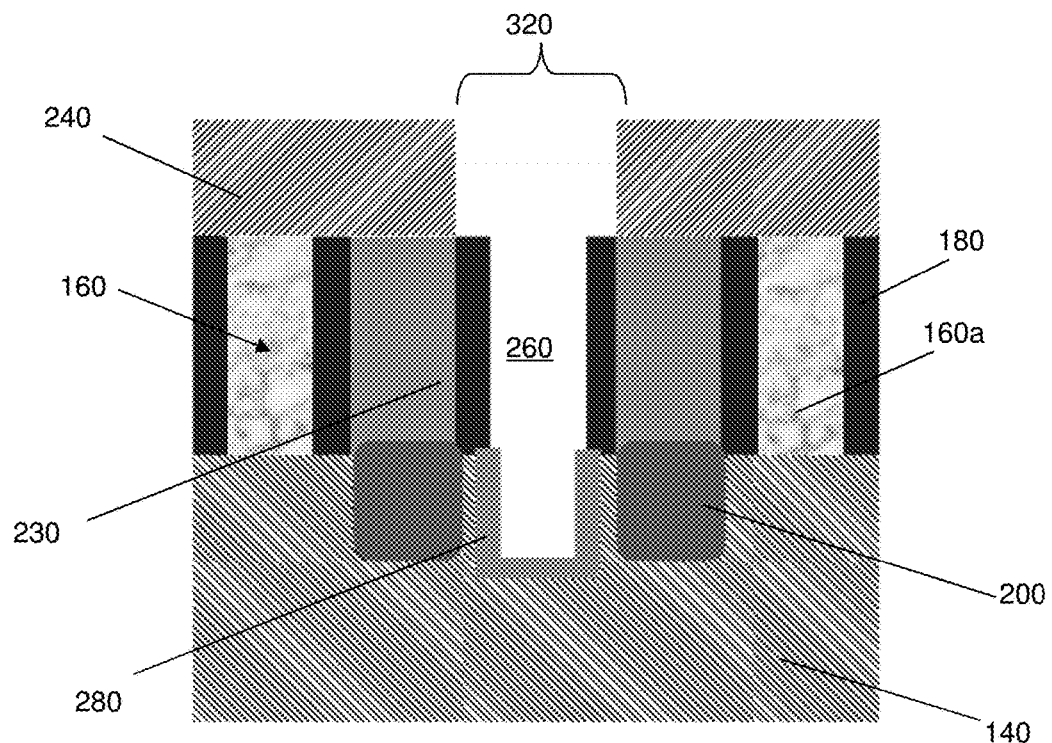
FIGS. 3A and 3B are cross-sectional views showing a liner, amongst other features, and respective fabrication processes in accordance with aspects of the present disclosure.
Figure 3B:
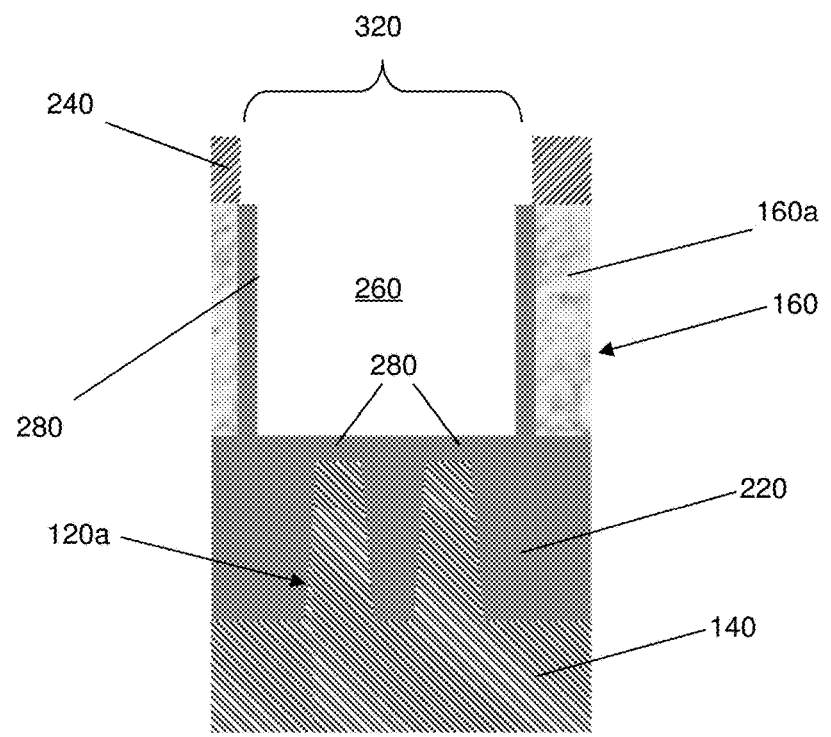

FIGS. 3A and 3B show the formation of a liner 280 within the trench 260, formed over exposed sidewalls of the dummy gate structures 160, i.e., directly on the polysilicon material 160a, and over the recessed fin structures 120a, as illustrated in FIG. 3B. More specifically, the liner 280 is formed within the undercut represented by distance D3 in FIG. 2A. Specifically, the liner 280 is below a bottom surface of the sidewall spacers 180. Further, the liner 280 can have a thickness less than a thickness of a sidewall spacer 180. In this way, the liner 280 will separate the source and drain regions 200 from the single diffusion break region 320, thereby preventing the source and drain regions 200 from being damaged during etching of the single diffusion break region 320.

In embodiments, the liner 280 is an oxide material formed through an oxidation process. In the oxidation process, the liner 280 will not form on the low-k material of the sidewall spacers 180, but instead forms on the Si material of the recessed fin structures 120a and the substrate material 140. The liner 280 protects the epitaxial material of the source and drain regions 200 from the etching process. That is, the etching will only result in or limit an undercut of D3. More specifically, as subsequent etching continues in order to form a trench for a diffusion break, the liner 280 will limit the size of the undercut D3, hence preventing erosion of the substrate material 140 and eventual exposure of the source and drain regions 200. Accordingly, the liner 280 prevents D3 from increasing in size, thereby protecting the source and drain regions 200 from etching processes. In embodiments, the liner 280 can have a thickness of about 2.5 nm; although other dimensions are contemplated herein in order to protect the source and drain regions 200 from the undercut D3.

Figure 4A:
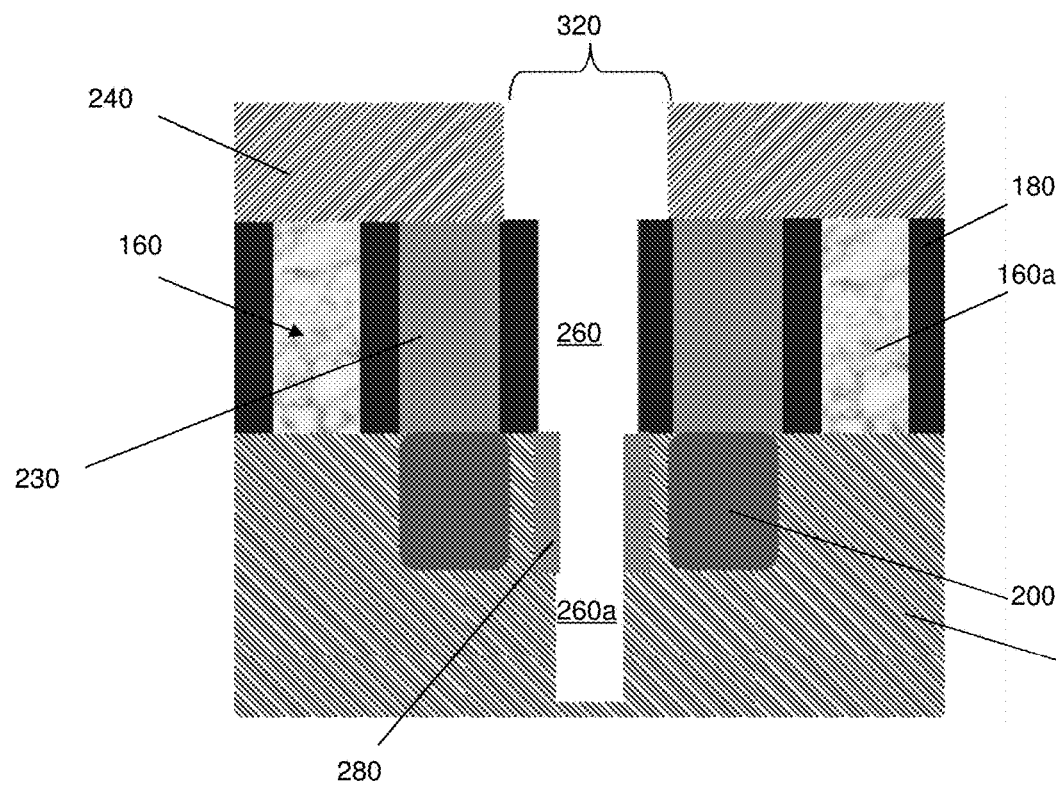
FIGS. 4A and 4B are cross-sectional views showing a single diffusion break cut, amongst other features, and respective fabrication processes in accordance with aspects of the present disclosure.
Figure 4B:
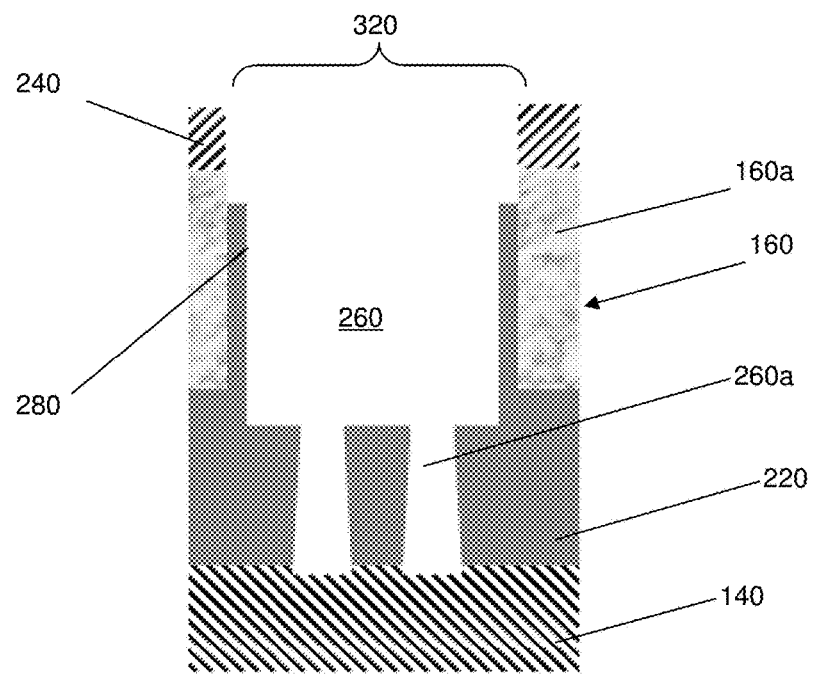

FIGS. 4A and 4B are cross-sectional views showing an upper portion of a single diffusion break cut, e.g., trench 260, and a lower portion of a single diffusion break cut, e.g., trench 260a, amongst other features, and respective fabrication processes. More specifically, an etching process with a selective chemistry, e.g., RIE, will be used to further open the single diffusion break region 320 by forming a trench 260a. In this way, the etching is a downward etch into the substrate material 140. In embodiments, the etching to form the trench 260a will recess the liner 280 below the polysilicon material 160a as illustrated in FIG. 4B.

Continuing with FIGS. 4A and 4B, an anisotropic etch is performed to remove a portion of the liner 280 within the trench 260, thereby exposing a portion of the substrate material 140 of the recessed fin structures 120a. More specifically, a bottom surface of the liner 280 is etched to expose the substrate material 140 of the fin structures 120. In embodiments, a portion of the substrate material can separate the source and drain regions 200, i.e., diffusion regions, from the liner 280.

The exposed substrate material 140 will undergo a further anisotropic etch to remove the recessed fin structures 120a, thereby forming trenches 260a. To achieve the tapering of the trenches 260a shown in FIG. 4B, an isotropic component is added to the anisotropic etch. More specifically, in embodiments, the recessed fin structures 120a are removed by an aggressive etching process, i.e., which is selective to the substrate material 140 of the fin structures. This aggressive etching ensures that all fin material (substrate material 140) is removed, even in the tapered areas. In this way, there is no residual substrate material 140 in the trenches 260a thereby preventing any shorts from occurring during device operation (which can otherwise result from the tapered profile of the fin structures).

The anisotropic etch which forms the trenches 260a is a directional etch which etches preferably downward, not laterally. More specifically, the liner 280 prevents the anisotropic etch process from laterally etching the substrate material 140. The prevention of a lateral etch in forming the trench 260a, i.e., the deep trench undercut, allows for the preservation of the epitaxial material of the source and drain regions 200, i.e., diffusion regions. Advantageously, by eliminating damage and/or defects to the epitaxial source and drain regions 200 during replacement metal gate processes, e.g., during deep trench etch processes to remove the dummy gate material, device performance can be maintained while enjoying the benefits of an aligned single diffusion break.

Figure 5A:
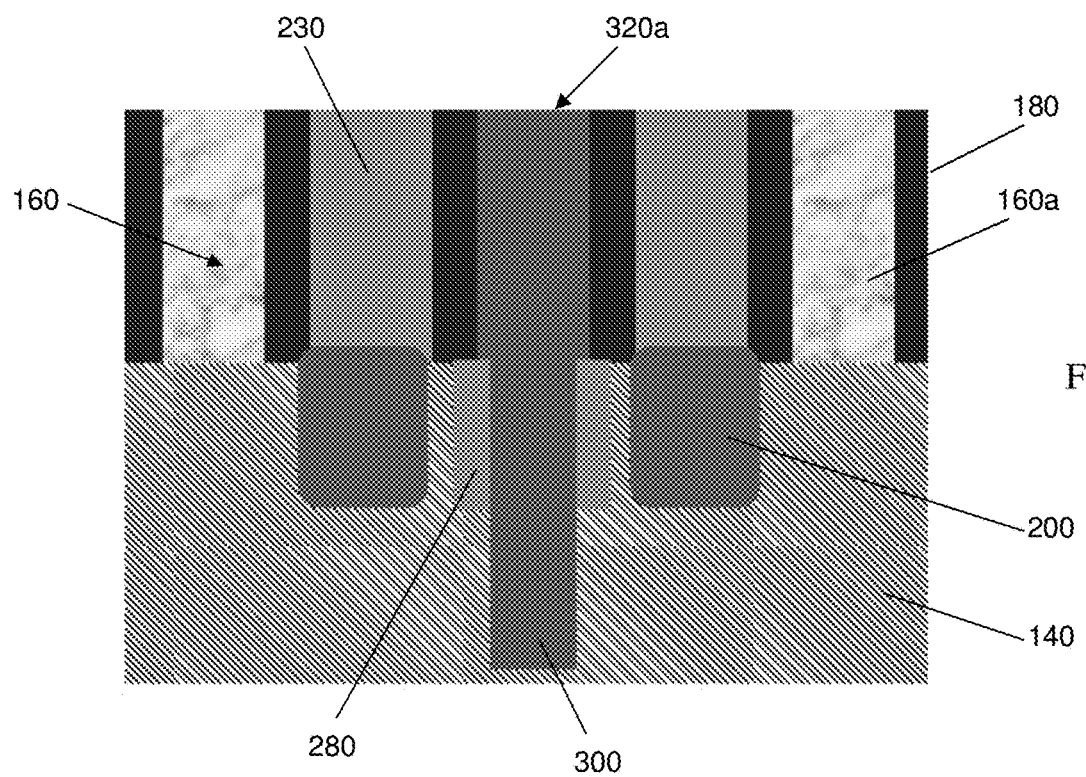
FIGS. 5A and 5B are cross-sectional views showing a dielectric fill, amongst other features, and respective fabrication processes in accordance with aspects of the present disclosure.
Figure 5B:
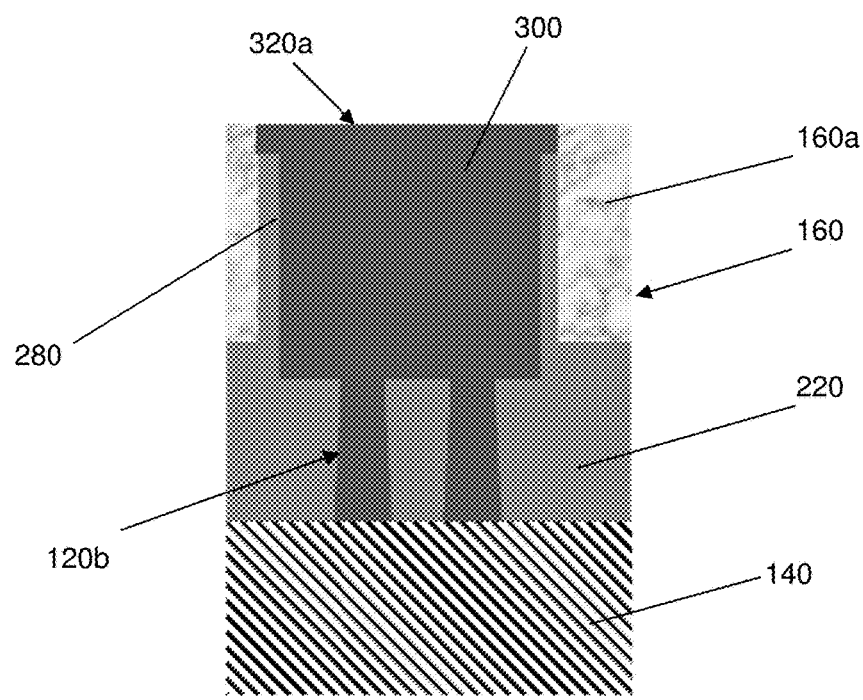

FIGS. 5A and 5B show the formation of the single diffusion break 320a by the deposition of a dielectric material 300 within the trenches 260, 260a. The dielectric material 300 serves as an insulator material between the diffusion regions, i.e., source and drain regions 200, thereby forming the single diffusion break 320a. In this way, the single diffusion break 320a is filled with an insulator material, i.e., dielectric material 300. In embodiments, the dielectric material 300 is deposited by a CVD process, thereby forming the dielectric fin structures 120b. In this way, the fin structures, i.e., the dielectric fin structures 120b, are composed of an insulator material, i.e., dielectric material 300. More specifically, the dielectric fin structures 120b and the single diffusion break 320a are composed of the same material.

As illustrated in FIG. 5B, the single diffusion break 320a extends below the diffusion regions, i.e., source and drain regions 200. In this way, the single diffusion break 320a extends past the liner 280. Accordingly, the liner 280 is positioned at a middle portion directly along sidewalls of the single diffusion break 320a, while upper and lower portions of the single diffusion break 320a do not have the liner 280 directly on sidewalls of the single diffusion break 320a in the upper and lower portions of the single diffusion break 320a. In this way, the dielectric material 300 of the single diffusion break 320a is separated from the source and drain regions 200 by the liner 280. Further, the dielectric material 300 of the single diffusion break 320a extends from a top surface of the sidewall spacers 180 and below past bottom surfaces of the sidewall spacers 180 and the liner 280. Additionally, the liner 280 is positioned below the bottom surface of the sidewall spacers 180 and can extend a depth of the source and drain regions 200. In this way, the dielectric material 300 is separated from the source and drain regions 200 by the liner 280, with the liner 280 being between the source and drain regions, the substrate material 140 and the single diffusion break 320a. However, it is contemplated herein that the liner 280 can be on the lower portion, depending on the depth of the single diffusion break region.

After deposition of the dielectric material 300, the hardmask 240 is removed by a conventional oxygen ashing process or other known stripants. Following removal of the hardmask 240, the dielectric material 300 is planarized by a CMP process to expose the polysilicon material 160a of the dummy gate structures 160.

Due to the preservation of the source and drain regions 200 during fabrication of the single diffusion break 320a, several advantages are obtained. Benefits include a relatively wider single diffusion break process window along with a self-aligned reverse block of a fin cut. Further, there is improvement in the epitaxial growth in the source and drain regions 200 because of the protection provided by the liner 280. This allows for device performance to be maintained. Another benefit is that there is a less gate height budget requirement, since there are no boundary issues for the subsequently formed replacement gate structures. More specifically, the device is free from boundary induced issues, such as metal in-complete fill, metal stress and/or impact. Additionally, the fin structures 120 are cut before removal of the polysilicon material 160a, thereby retaining channel strain.

Figure 6A:
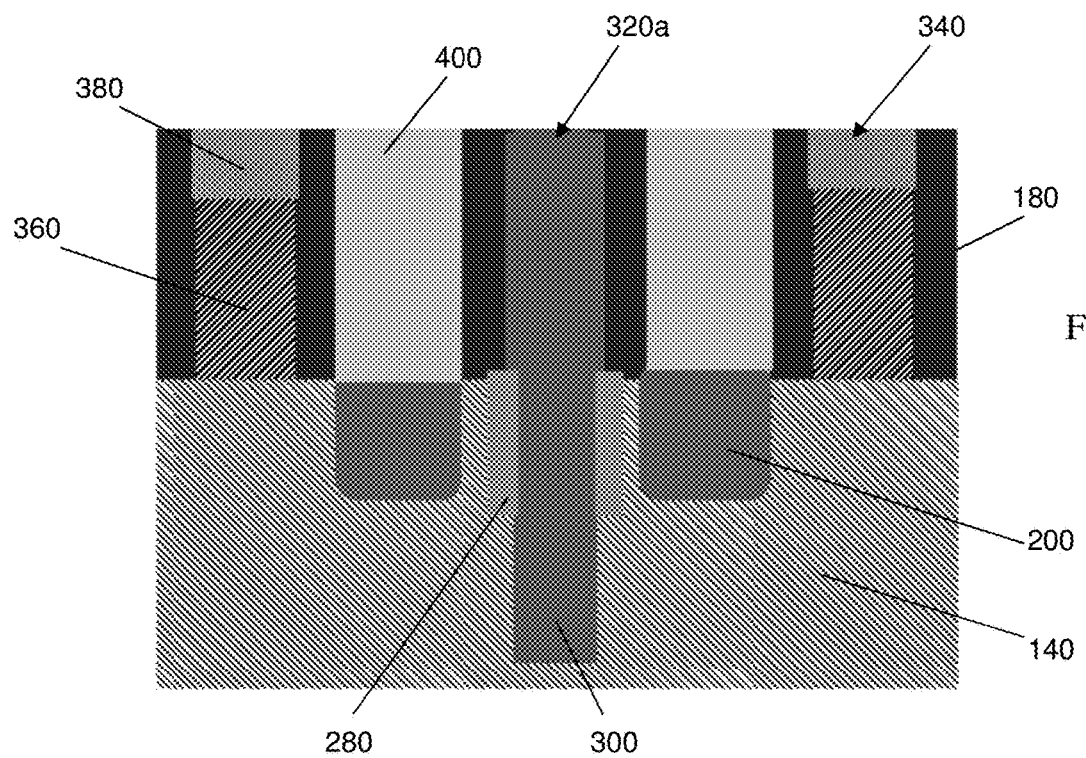
FIGS. 6A and 6B are cross-sectional views showing replacement gate structures, amongst other features, and respective fabrication processes in accordance with aspects of the present disclosure.
Figure 6B:
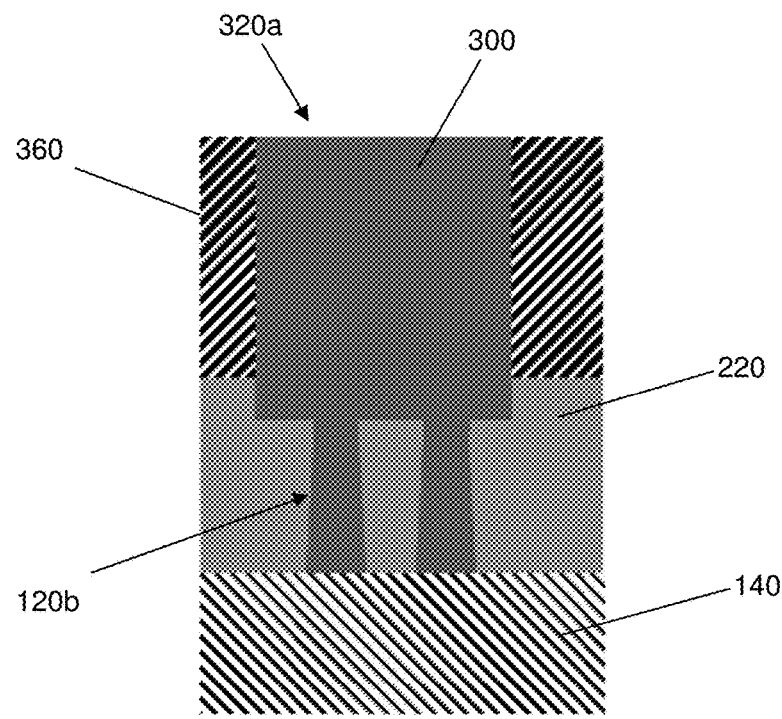

FIGS. 6A and 6B show replacement gate structures 340, amongst other features, and respective fabrication processes. More specifically, the polysilicon material 160a of the dummy gate structures 160 are removed by a selective etch chemistry process and replaced with gate materials 360. Further, liner 280 is removed during the dummy gate removal process and gate clean process. The gate materials 360 can be composed of a high-k dielectric material and a metal material, e.g., tungsten or other workfunction metal. In this way, the replacement gate structures 340 are metal gate structures. In this way, the dielectric material 300 of the single diffusion break 320a extends from a top surface of the gate structures 340 to below bottom surfaces of the sidewall spacers 180, the source and drain regions 200 and the liner 280.

A capping material is deposited over the gate materials 360 to form the gate cap 380. In embodiments, the capping material can be a nitride material, for example. The gate materials 360 and the capping material can be deposited by a conventional deposition process, e.g., CVD, followed by a CMP process. In this way, the processes described herein provide for forming a plurality of fin structures 120 from a substrate material 140, and forming dummy gate structures 160 comprising dummy material, i.e., polysilicon material 160a, over the plurality of fin structures 120. Additionally, the following steps are disclosed: forming diffusion regions, i.e., source and drain regions 200, adjacent to the dummy gate structures 160; forming a first trench 260 in the dummy material, i.e., polysilicon material 160a; forming a liner 280 within the first trench 260; etching a bottom surface of the liner 280 to form a second trench 260a within the substrate material 140; filling the first trench 260 and the second trench 260a with a dielectric material 300 to form a single diffusion break 320a having the liner 280 on its sidewalls; and replacing the dummy gate structures 160 with replacement gate structures 340.

Source and drain metallization features 400 are formed on the source and drain regions 200. In embodiments, the source and drain metallization features 400 comprise a silicide liner, which can be composed of Ti, Ni, NiPt and Co, amongst other examples. The source and drain metallization features 400 further comprise a metal material deposited on the silicide liner. In embodiments, the metal material can be composed of Co, W or Ru, for example. In this way, the structures and processes described herein provide for a plurality of fin structures, i.e., the dielectric fin structures 120b, and a plurality of replacement gate structures 340 extending over the plurality of fin structures. In addition, a plurality of diffusion regions, i.e., source and drain regions 200, adjacent to the each of the plurality of replacement gate structures 340. Further, a single diffusion break 320a is between the diffusion regions of the adjacent replacement gate structures 340, and a liner 280 separates the single diffusion break 320a from the diffusion regions.

Additionally, FIGS. 6A and 6B illustrate a structure with a substrate material 140, and a plurality of metal gate structures, i.e., replacement gate structures 340, on the substrate material 140 and comprising sidewall spacers 180, metal material, i.e., gate materials 360, and source and drain regions 200. Further, a single diffusion break 320a is between adjacent metal gate structures of the plurality of metal gate structures, the single diffusion break 320a extending into the substrate 140; and a liner 280 on sidewalls of the single diffusion break 320a separating the single diffusion break 320a from the source and drain regions 200.

FIGS. 7A-7E show views of a gate cut region 420 and gate cut 420a, which can be implemented simultaneously along with the formation of the single diffusion break 320a of FIGS. 1A-6B. More specifically, FIGS. 7B-7E are cross-sectional views along line YY-YY of FIG. 7A, which shows the formation of a gate cut region 420. In this way, the structures and processes described herein provide for a gate cut 420a along a longitudinal axis YY-YY of the metal gate structures, i.e., replacement gate structures 340.

Figure 7A:
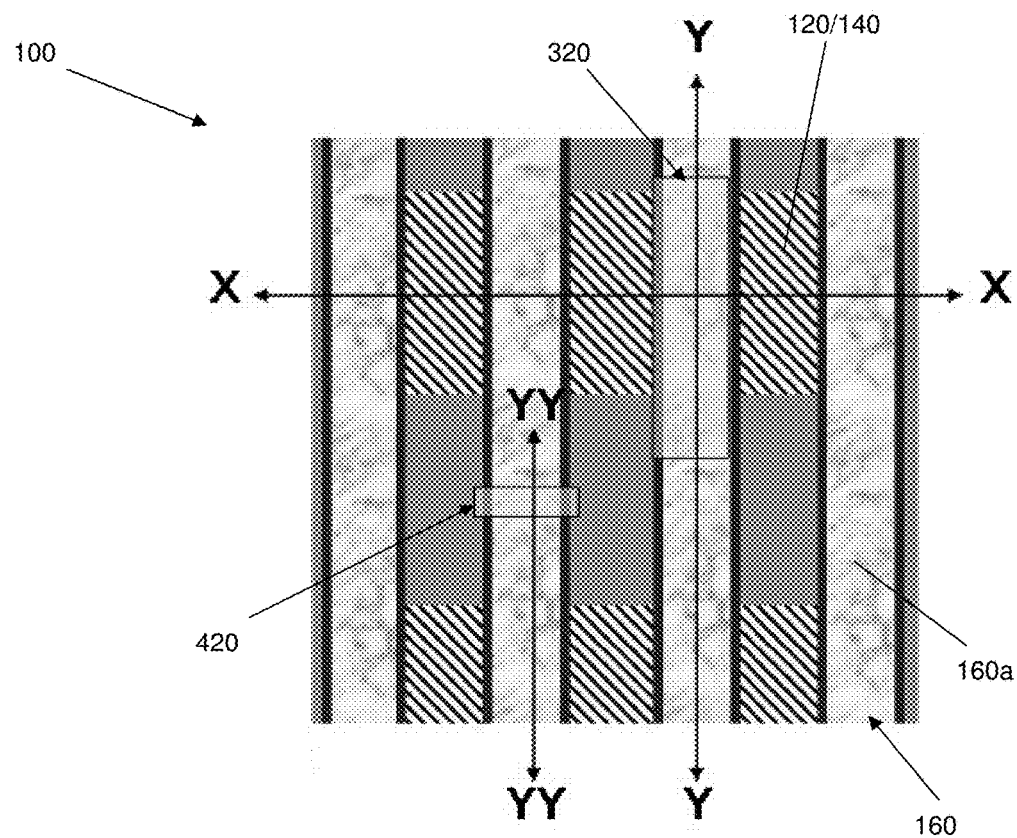
FIG. 7A is a top view of gate structures, amongst other features, and respective fabrication processes in accordance with aspects of the present disclosure.
Figure 7B:
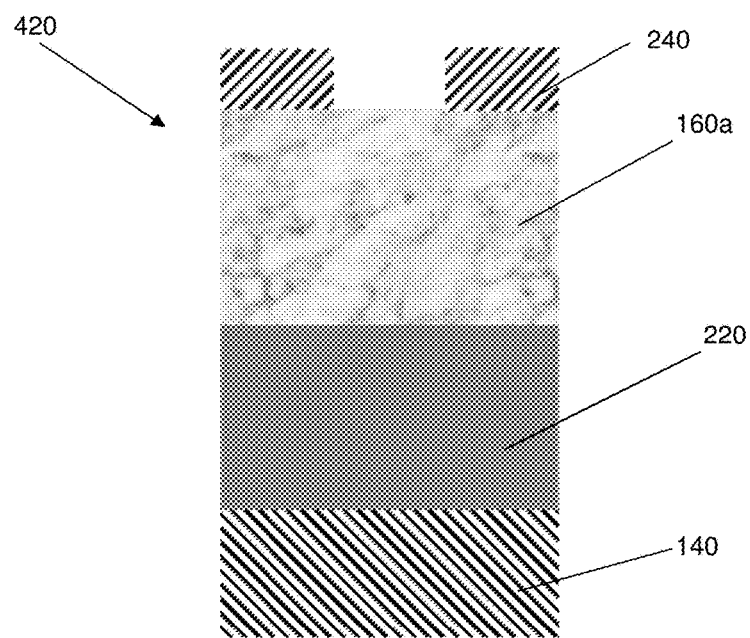
FIGS. 7B-7E show the gate cut structures of FIG. 7A, amongst other features, and respective fabrication processes in accordance with aspects of the present disclosure.

Similar to the processes already described in FIGS. 1A-6B, in FIGS. 7A and 7B, a hardmask 240 is formed over the polysilicon material 160a of the dummy gate structures 160. An etching process with a selective chemistry, e.g., RIE, is used to open the gate cut region 420 to form a trench 260b, i.e., a third trench. The trench 260b will act as a gate cut 420a along a longitudinal axis of the replacement gate structures shown in FIGS. 6A and 6B. A liner 280 is deposited within the trench 260b. In this way, the gate cut 420a is lined with the liner 280.

Figure 7C:
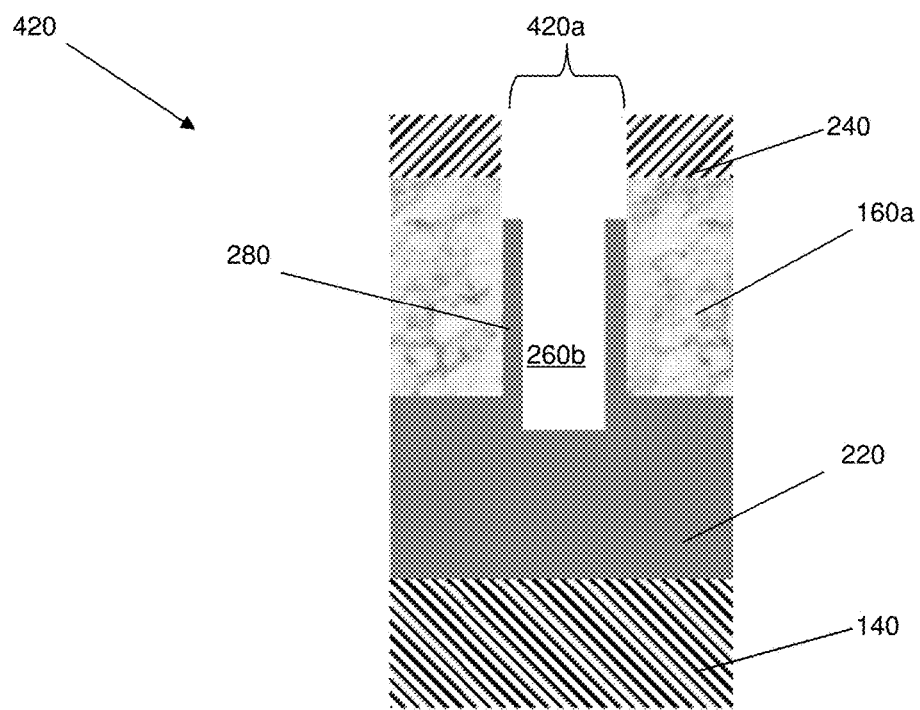

Continuing with FIG. 7C, the liner 280 is formed through an oxidation process within the trench 260b. In embodiments, the liner 280 is formed over exposed sidewalls of the dummy gate structures 160, i.e., directly on the polysilicon material 160a. The etching to form the trench 260a of FIG. 4B will recess the liner 280 below the polysilicon material 160a, as illustrated in FIG. 7C.

Figure 7D:
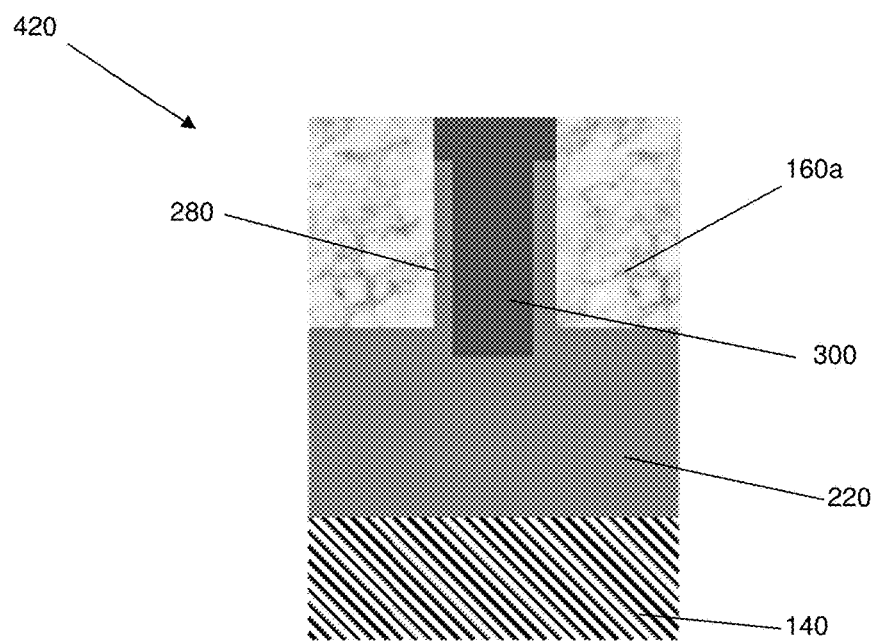

FIG. 7D shows the deposition of a dielectric material 300 within the trench 260b, i.e., within the gate cut 420a. As shown in FIGS. 1A-6B, the deposition of the dielectric material 300 forms the single diffusion break 320a. In this way, the gate cut 420a is filled with a same material as the single diffusion break 320a, i.e., the gate cut 420a and the single diffusion break 320a are composed of the same material. In embodiments, the dielectric material 300 is deposited by a CVD process. The hardmask 240 is removed by a conventional oxygen ashing process or other known stripants. The dielectric material 300 is then planarized by a CMP process to expose the polysilicon material 160a of the dummy gate structures 160.

Figure 7E:
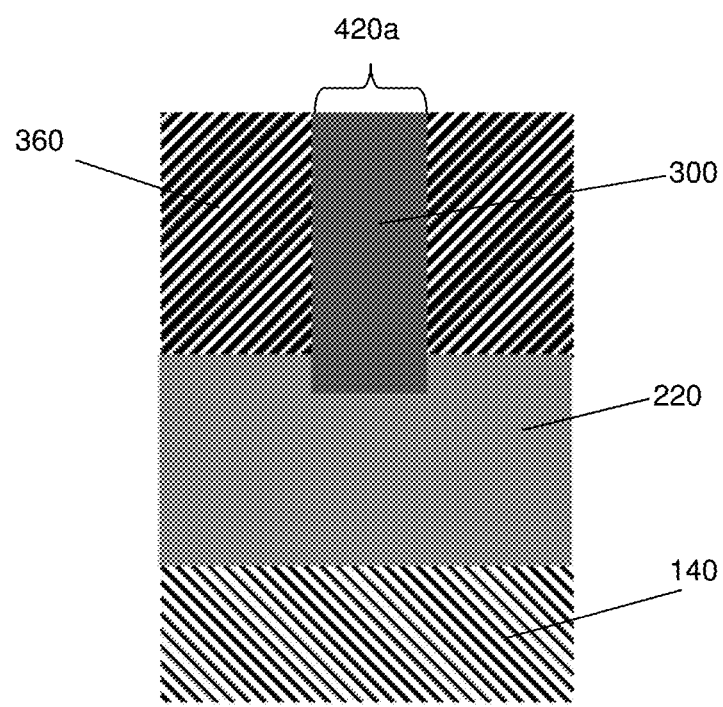

FIG. 7E shows the polysilicon material 160a of the dummy gate structures 160 of FIGS. 1A-5B removed. In embodiments, the polysilicon material 160a is removed by a selective etch chemistry process and replaced with gate materials 360. Additionally, the liner 280 is removed during the gate clean process, e.g., an isotropic etch. The gate materials 360 can be composed of a high-k dielectric material and a metal material, e.g., tungsten or other workfunction metal. In embodiments, the gate materials 360 are deposited by a conventional deposition process, followed by a CMP process.

It should now be understood that the processes and resultant structures described herein will serve to further protect the epitaxial material of the diffusion regions by implementing a liner to prevent a lateral etching during the formation of a deep trench undercut for a single diffusion break. By having the etching prevented laterally by the liner, the integrity of the epitaxial material of the source and drain regions is maintained. This allows for device performance to be maintained, while also enjoying the benefits provided by a single diffusion break. Accordingly, the processes and structures described herein will increase device performance.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a substrate material;
   a plurality of fin structures;
   a plurality of gate structures extending over the plurality of fin structures;
   an isolation region comprising a bottom surface directly contacting a top surface of the substrate material and a top surface directly contacting a bottom surface of the plurality of gate structures;
   a plurality of diffusion regions adjacent to the each of the plurality of gate structures;
   a single diffusion break between the diffusion regions of the adjacent gate structures;
   a liner on a lower sidewall portion of the single diffusion break separating the single diffusion break from the diffusion regions, wherein an upper sidewall portion of the single diffusion break, above upper surfaces of the diffusion regions, is devoid of the liner; and
   a plurality of dielectric fin structures within the isolation region, each of the dielectric fin structures comprising a bottom surface directly contacting the top surface of the substrate material and a top surface below the top surface of the isolation region.

2. The structure of claim 1, wherein the single diffusion break and the plurality of dielectric fin structures comprise a same insulator material.

3. The structure of claim 1, wherein the single diffusion break extends below the diffusion regions, and the diffusion regions comprise source and drain regions.

4. The structure of claim 1, further comprising a gate cut along a longitudinal axis of the gate structures.

5. The structure of claim 4, wherein the gate cut is a same material as the single diffusion break.

6. The structure of claim 1, wherein the gate cut is lined with the liner, the gate structures comprise sidewall spacers and gate materials comprising a high-k dielectric material and a metal material, and the fin structures comprise the substrate material.

7. The structure of claim 6, further comprising a gate cap over the gate materials and an undercut of the substrate material beneath select sidewall spacers, wherein the liner is positioned within the undercut.

8. The structure of claim 7, wherein the liner is below the sidewall spacers and between a portion of the substrate material and the single diffusion break.

9. The structure of claim 1, wherein an entirety of the upper sidewall portion of the single diffusion break, above uppermost surfaces of the diffusion regions, is devoid of the liner.

10. The structure of claim 9, further comprising a gate cut along a longitudinal axis of the gate structures, wherein:
    the gate cut is lined with the liner;
    the gate structures comprise sidewall spacers and the fin structures comprise the substrate material;
    an uppermost surface of the liner abuts a first portion of a lowermost surface of the sidewall spacers;
    the liner is between a portion of the substrate material and the single diffusion break;
    the portion of the substrate material abuts a second portion of the lowermost surface of the sidewall spacers; and
    the second portion of the lowermost surface of the sidewall spacers is between sidewalls of the source and drain regions and the single diffusion break.

11. A structure comprising:
    a substrate material;
    a plurality of metal gate structures on the substrate material and comprising sidewall spacers and metal material;
    an isolation region comprising a bottom surface directly contacting a top surface of the substrate material and a top surface directly contacting a bottom surface of the plurality of metal gate structures;
    source and drain regions;
    a single diffusion break structure between adjacent metal gate structures of the plurality of metal gate structures, the single diffusion break structure extending into the substrate material;
    a liner on a lower portion of sidewalls of the single diffusion break structure separating the single diffusion break structure from the source and drain regions, and wherein an upper portion of the sidewalls of the single diffusion break structure, above upper surfaces of the source and drain regions, is devoid of the liner; and
    a plurality of dielectric fin structures within the isolation region, each of the dielectric fin structures comprising a bottom surface directly contacting the top surface of the substrate material and a top surface below the top surface of the isolation region,
    wherein the dielectric fin structures and the single diffusion break include a same material.

12. The structure of claim 11, wherein the single diffusion break structure and the plurality of dielectric fin structures are filled with insulator material.

13. The structure of claim 11, further comprising a gate cute along a longitudinal axis of the metal gate structures, and the metal gate structures comprise gate materials comprising a high-k dielectric material and a metal material.

14. The structure of claim 13, further comprising a gate cap over the gate materials, wherein the gate cut and the single diffusion break structure are composed of the same material.

15. The structure of claim 14, wherein the gate cut is lined with the liner, and the metal gate structures comprise sidewall spacers and the fin structures comprise the substrate material.

16. The structure of claim 15, further comprising an undercut of the substrate material beneath select sidewall spacers, wherein the liner is positioned within the undercut.

17. The structure of claim 16, wherein an uppermost surface of the liner abuts a first portion of a lowermost surface of the sidewall spacers.

18. The structure of claim 17, wherein the liner is between a portion of the substrate material and the single diffusion break structure.

19. The structure of claim 18, wherein the portion of the substrate material abuts a second portion of the lowermost surface of the sidewall spacers, and the second portion of the lowermost surface of the sidewall spacers is between sidewalls of the source and drain regions and the single diffusion break structure.

20. The structure of claim 11, wherein an entirety of the upper sidewall portion of the single diffusion break structure, above uppermost surfaces of the diffusion regions, is devoid of the liner.

21. A method comprising:
forming a substrate material;
forming a plurality of fin structures;
forming a plurality of gate structures extending over the plurality of fin structures;
an isolation region with a bottom surface directly contacting a top surface of the substrate material and a top surface directly contacting a bottom surface of the plurality of metal gate structures;
forming a plurality of diffusion regions adjacent to the each of the plurality of gate structures;
forming a single diffusion break between the diffusion regions of the adjacent gate structures;
forming a liner on a lower sidewall portion of the single diffusion break separating the single diffusion break from the diffusion regions, wherein an upper sidewall portion of the single diffusion break, above upper surfaces of the diffusion regions, is devoid of the liner; and
forming a plurality of dielectric fin structures within the isolation region, each of the dielectric fin structures comprising a bottom surface directly contacting the top surface of the substrate material and a top surface below the top surface of the isolation region.

\* \* \* \* \*